LOGARITHMIC GAIN TUNED AMPLIFIER

Filed Aug. 29, 1961

WITNESSES
Leon J. Taza
Leon M. Garman

INVENTORS
Irving F. Barditch, Francis Rachal
and William Freeman
BY M. J. Brodahl
ATTORNEY United States Patent Office 3,206,620

Patented Sept. 14, 1965

3,206,620

LOGARITHMIC GAIN TUNED AMPLIFIER

William Freeman and Irving F. Barditch, Baltimore, Md., and Francis Rachal, Washington, La., assignors to Westinghouse Electric Corporation, East Pittsburgh, Pa., a corporation of Pennsylvania Filed Aug. 29, 1961, Ser. No. 134,676

2 Claims. (Cl. 307—88.5)

The present invention relates to tuned amplifier circuits, and more particularly to tuned amplifier circuits having a logarithmic gain.

It is often desirable to provide an amplifier which supplies output signals that are a logarithmic function of the input signals applied thereto. For example, in communication and radar equipment, a logarithmic gain function is desirable because the intensity of the received signals varies inversely with distance and over a considerable range of amplitudes. In order to avoid the problems of saturating the circuit components and having excessive power requirements for the components, it is desirable that as the input signals increase, the output signals of the amplifier increase only at logarithmic rate rather than directly. Also the present invention may readily be incorporated into a monolithic or molecular block form since no inductors, the inductive characteristic not being readily obtainable presently in monolithic form, are required.

It is therefore an object of the present invention to provide a new and improved logarithmic gain tuned amplifier.

The present invention broadly provides a logarithmic gain tuned amplifier wherein, a tuned amplifier stage receives incoming signals and utilizes a phase shift resistor-capacitor (R-C) filter in the feedback loop to tune the amplifier to the frequency of the incoming signals. An automatic gain control stage including an output transistor receives the signals from the tuned stage and develops gain control signals which are utilized to control the gain of the transistor, so that the output signals of the transistor are a logarithmic function of the incoming signals.

Figure 1:
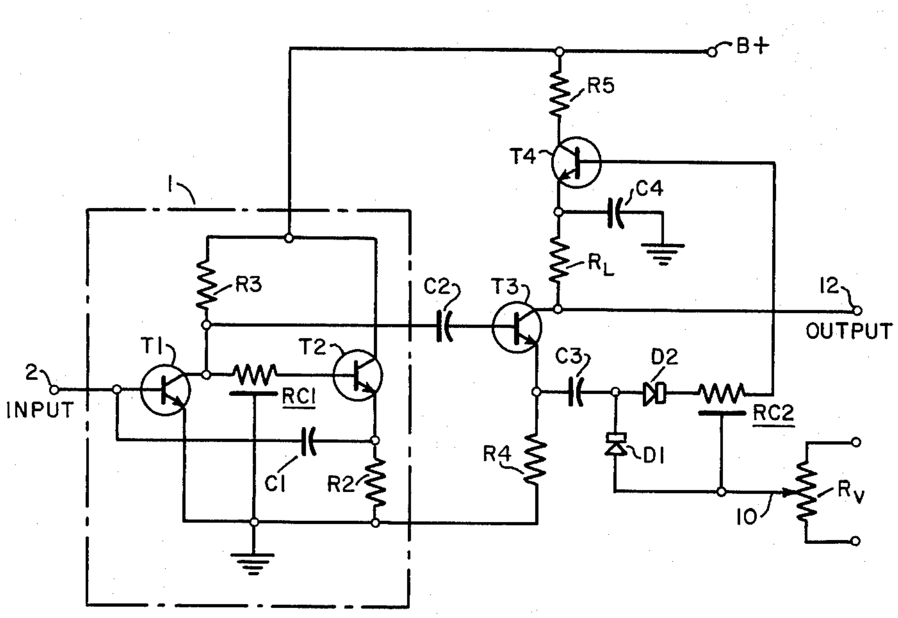
Figure 2:
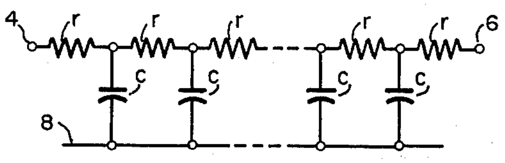

These and other objects of this invention will become more apparent when considered in view of the following specification and drawings, in which:

FIGURE 1 shows a schematic diagram of a logarithmic gain tune amplifier as embodied in the present invention, and FIG. 2 is a schematic diagram of an equivalent circuit of a phase shift RC filter as utilized in the present invention.

Referring to FIG. 1, incoming signals, which may for example be at an intermediate frequency, are applied to the tuned amplifier 1, comprising the transistors T1 and T2 through the terminal 2 to the base of the transistor T1. A feedback loop is provided through the phase shift filter RC1, the base-emitter circuit of the transistor T2 and the capacitor C1, to the base of the transistor T1. The emitter of the transistor T1 is connected to ground, and the emitter of the transistor T2 is connected through the resistor R2 to ground. The output of the tuned amplified 1 is taken directly from the collector of the transistor T1. The biasing resistor R3 is connected between the collectors of the transistors T1 and T2, with the collector of the transistor T2 being connected directly to a B+ bias source, not shown.

An equivalent circuit for the phase shift filters RC1 and RC2 of FIG. 1 are shown in FIG. 2, with the incremental resistors *r* connected between the terminals 4 and 6, and the incremental capacitors *c* connected between the incremental resistors *r* and the common line 8. The phase shift characteristic of the filter may be controlled by adjusting the values of the incremental capacitors *c*. A well known semiconductor device which provides the phase shift characteristics may be used. The semiconductor device comprises a p-type region and an n-type region of semiconductivity, with a p–n junction therebetween, which is back biased; thus providing the distributed capacitive effect. By controlling the amount of biase potential applied across the p–n junction, the value of the capacitance and so the transfer characteristics of the filter may be controlled in response to the bias potential. For a further discussion of such a semiconductor device see "Semiconductor Networks for Microelectronics," Electronics, May 13, 1960, pp, 69–78.

The tuned amplifier 1 is of the type tuned by regenerative feedback of a selected passband of frequencies. This is accomplished by the novel bandpass feedback configuration shown in FIG. 1. The basic amplifier is described and claimed in copending application Serial No. 89,499, entitled "Low Insertion Loss Unilateralization Structure," filed February 15, 1961 in the names of Irving F. Barditch, Robert Bento and William Freeman, and assigned to the assignee of this application.

The particular configuration is particularly adaptable to monolithic block fabricaton. It will be apparent from the drawings that all of the components, including the AGC configuration, can be incorporated in a single monolithic block with only external input, output and biasing terminals being provided. When the AGC configuration is combined with the amplifier configuration a non-linear bandpass amplifier is provided which does not require physical inductances.

The RC1 network provides a transport time delay, the electrical phase-change equivalent of which when added to the electrical phase shift that takes place in transistor T1 provides a positive feedback for a selected frequency band to the input of transistor T1, thereby providing a tunable bandpass amplifier.

By controlling the phase shift characteristics of the phase shift filter RC1, the tuned amplifier may be tuned to the frequency of the incoming signal so providing a maximum output when the input is at the predetermined frequency. The output signals from the collector of the transistor T1 are applied through the coupling capacitor C2 to the base of the output transistor T3. The resistor R4 is connected between the emitter of the transistor T3 and ground. Also connected to the emitter of the emitter follower transistor T3 is the coupling capacitor C3 which is in turn connected to the diode clamping circuit comprising the diodes D1 and D2. The anode of the diode D1 is connected to the tap 10 on the potentiometer $R_V$. The setting of the tap 10 is adjusted to clamp the signals appearing at the emitter of the transistor T3 to a predetermined amplitude level. The rectified signals taken from the cathode of the diode D2 are filtered in the filter RC2, which is a low pass filter and may be a semiconductor device as described above. From the filter RC2, the clamped and rectified signals, acting as an automatic gain control, are applied to the base of the transistor T4. The collector of the transistor T4 is connected through the resistor R5 to the B+ source, with the emitter being connected to the load resistor $R_L$, which is shunted by the capacitor C4 to ground. The resistor $R_L$ is also connected to the collector of the output transistor T3 to serve as the load resistor for the transistor T3. So by controlling the conductivity of the transistor T4, the gain of the transistor T3 may be controlled by adjusting its load resistance. As the input signals increase in amplitude, the output of the tuned amplifier stage 1 will also increase. The increased amplitude signals will then be applied to the transistor T3, with the output signals being taken from the collector of the transistor T3. However, as the incoming signals increase, the automatic gain control signals taken from the emitter of the transistor T3 also increase, with the amplitude being controlled by the diode clamping circuit, including the biased diodes D1 and D2 and the potentiometer $R_V$. The increased amplitude gain control signals applied to the base of the transistor T4 render it more conductive, in the configuration shown and so decreases the output load of the transistor T3. The gain of the transistor T3 is thus decreased, so that the output signals taken from the collector of the transistor T3 do not increase as rapidly as the incoming signals applied to the base of the output transistor T3. By the adjustment and design of the circuit components of the load circuit including the transistor T4, the resistor $R_L$ and the diode clamping circuit, the gain control signals applied to the base of the transistor T4 may be so controlled as to cause the output signals from the collector of the transistor T3 to be substantially a logarithmic function of the incoming signals applied to the terminal 2. It may readily be seen that a logarithmic gain tuned amplifier may so be provided without the necessity of using physical inductors, and which is readily tuned to various desired frequencies through the phase shift filter RC1.

Although the present invention has been described with a certain degree of particularity, it should be understood that the present disclosure has been made only by way of example and that numerous changes in the details of circuitry and in the combination of arrangement of elements may be resorted to without departing from the scope and spirit of the present invention.

We claim as our invention:

1. A signal translation system comprising first and second transistor means connected in a cascode circuit configuration with the emitter of the first transistor means held at A.C. ground and said first transistor means serving as an AGC control device for said second transistor means said second transistor means serving as a paraphase amplifier; said cascode circuit including a first resistor connected to the collector of said first transistor means, a second resistor connected between the emitter of said first transistor means and the collector of said second transistor means and a third resistor connected between the emitter of said second transistor means and ground; rectifying means, a PN junction semi-conductor device having two regions of different conductivity, one of said regions being connected to ground, the other of said regions being connected in a circuit between the emitter of said second transistor means and the base of said first transistor means and including a rectifier, said PN junction device serving the dual purpose of a bypass capacitor for said rectifier and as a non-linear resistance responsive to the back bias voltage on said PN junction, whereby said first transistor means controls current through the cascode circuit to control the output of said second transistor as substantially a logarithmic function of the output signals.

2. A signal translation system comprising a first amplifier means for providing a selected level of input signal, an AGC system connected to the output of said first amplifier means comprising a first and second transistor means connected in a cascode circuit configuration with the emitter of said first transistor held at A.C. ground and serving as an AGC control for said second transistor means connected as a paraphase amplifier with its signal output on its collector and its AGC output at its emitter, said cascode circuit including a first resistor connected to the collector of said first transistor, a second resistor connected between the emitter of said first transistor means and the collector of said second transistor means and a third resistor connected between the emitter of said second transistor means and a point at signal ground potential, a rectifier, a PN junction semiconductor device having first and second regions of different conductivity, the first of said regions being connected to a point at a selected D.C. potential with respect to ground, a clamping diode connected between the input side of said rectifier and said first one of said regions of said semiconductor device, circuit means including said rectifier and the second of said regions of said semiconductor device connected between the emitter of said second transistor means and the base of said first transistor means, said PN junction device serving the dual purpose of a bypass capacitor for said rectifier and as a non-linear resistance whose value varies as a function of the back-bias voltage across said PN junction, whereby said first transistor means controls the current through the cascode circuit to control the output of said second transistor means as substantially a logarithmic function of the input signal.

References Cited by the Examiner

UNITED STATES PATENTS

| | | | |
|---|---|---|---|
| 2,854,630 | 9/58 | Folgelberg et al. | 328—210 |
| 2,898,411 | 8/59 | Chow | 330—29 |
| 2,967,236 | 1/61 | Freedman | 328—170 |
| 3,002,090 | 9/61 | Hirsch | 330—29 |
| 3,107,331 | 10/63 | Barditch et al. | 330—26 |

OTHER REFERENCES

Howard et al.: "Linear-to-Logarithmic" Electronics, July 1953.

ARTHUR GAUSS, *Primary Examiner.*

JOHN W. HUCKERT, *Examiner.*